(12) United States Patent
Szu

(10) Patent No.: US 7,815,453 B2
(45) Date of Patent: Oct. 19, 2010

(54) ELECTRICAL CONNECTOR WITH IMPROVED STIFFENER

(75) Inventor: Ming-Lun Szu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 224 days.

(21) Appl. No.: 11/986,936

(22) Filed: Nov. 26, 2007

(65) Prior Publication Data
US 2008/0124955 A1    May 29, 2008

(51) Int. Cl.
*H01R 13/62*    (2006.01)
(52) U.S. Cl. .................. 439/331; 439/73; 439/342
(58) Field of Classification Search .......... 439/260, 439/331, 73, 71, 330, 342
See application file for complete search history.

(56) References Cited
U.S. PATENT DOCUMENTS

| | | | |
|---|---|---|---|
| 4,354,720 A * | 10/1982 | Bakermans | 439/331 |
| 5,221,209 A * | 6/1993 | D'Amico | 439/71 |
| 5,398,164 A * | 3/1995 | Goodman et al. | 439/372 |
| 5,722,848 A | 3/1998 | Lai et al. | |
| 6,716,050 B1 * | 4/2004 | Ma et al. | 439/331 |
| 6,780,025 B2 * | 8/2004 | Ma et al. | 439/73 |
| 7,001,197 B2 | 2/2006 | Shirai et al. | |
| 7,029,309 B2 * | 4/2006 | Ma | 439/331 |
| 7,189,094 B2 | 3/2007 | Ma | |
| 7,234,955 B1 | 6/2007 | Ho | |
| 7,241,161 B2 | 7/2007 | Mar | |

* cited by examiner

*Primary Examiner*—Briggitte R Hammond
(74) *Attorney, Agent, or Firm*—Andrew C. Cheng; Wei Te Chung; Ming Chieh Chang

(57) ABSTRACT

An electrical connector assembly (100) includes a first retaining half (51) securely mounted on a printed substrate, a load plate (60) pivotally attached to the first retaining half, a second retaining half (52) opposite and distant to the first retaining half, a lever (70) pivotally attached to the second retaining half and including a cam portion (706) capable of pushing down a pressed section (610) from the clip toward the printed substrate, and a connector (30) mounted between the first and second retaining halves.

18 Claims, 3 Drawing Sheets

ELECTRICAL CONNECTOR WITH IMPROVED STIFFENER

BACKGROUND OF THE INVENTION

1. Field of the Invention

The present invention generally relates to an electrical connector, and more particularly to an electrical connector for removably mounting a chip module to a printed circuit board. The connector is associated with a clip which is individually assembled to a printed substrate by a first device, and pressed to the connector by a lever individually mounted opposite to the clip by a second device.

2. Description of Related Art

An electrical connector for electrically connecting a chip module to a printed circuit board comprises an insulative housing, a plurality of conductive contacts received in the insulative housing, a stiffener partially surrounding the insulative housing, and a load plate and a lever pivotally mounted to the stiffener. The stiffener is a substantially rectangular frame and comprises a pair of opposite retaining portions to which the load plate and the lever are pivotally mounted and a pair of connecting arms connecting the pair of retaining portions. Usually, the stiffener is stamped from a sheet metal, such as stainless steel which is of high price. In assembly, the insulative housing is connected to the stiffener removably or immovably. Then, the retaining portions are connected to the printed circuit board via retaining means, such as screws, to realize the electrical connection between the contacts and the printed circuit board. Then the chip module is placed on the insulative housing to realize the electrical connection between the chip module and the contacts. Finally, the load plate is placed on the chip module with the lever is rotated until latching with the stiffener. Therefore, the stable electrical connection between the chip module and the printed circuit board is achieved.

U.S. Pat. No. 5,722,848 issued to Lai on Mar. 3, 1998 discloses a typical connector socket, and which is generally referred to as ZIF socket. In generally, the socket generally includes a base with a plurality of contacts assembled therein, and a cover moveably attached to the base. A lever along with a cam mechanism is arranged between the base and cover so as to drive the cover from a first position to a second position. When the lever is located in a vertical position, the cover is located at the first position, in which a hole in the cover is completely in align with a corresponding passageway in the base. In this position, a pin leg of a CPU can be inserted from the cover into the passageway without any engagement with the contact. When the CPU is properly seated on the cover, then the lever is moved from the vertical position to a horizontal position, and simultaneously driving the cover from the first position to the second position. During this process, the pin leg of the CPU is then in contact with the contact within the base.

U.S. Pat. No. 7,001,197 issued to Shirai on Feb. 21, 2006 discloses another type of connector socket, and which can be generally called LGA socket. As clearly shown in Figures, the socket generally includes a metal stiffener with a housing securely supported therein. Then a metal clip is pivotally assembled to the stiffener. On the other hand, a clip is pivotally assembled to the other side of the stiffener and when the clip is closed to the stiffener, the lever having a cam can lock the clip to a closed position. By this arrangement, if before the clip is closed, and a CPU is seated on the housing, then the clip will tightly press the CPU toward the housing ensuring proper electrical connection therebetween.

However, the electrical connector with above structures has at least the shortcomings as follows: The high-cost metal stiffener, or the high-cost stainless steel, causes the cost of the whole electrical connector is increased which is not glad to be seen by manufactures or customers, even consumers.

Therefore, it is desired to provide an improved electrical connector to stress the problems mentioned above.

BRIEF SUMMARY OF THE INVENTION

Accordingly, an object of the present invention is to provide an electrical connector with improved stiffener structures with lower cost.

In order to achieve the above-mentioned object, an electrical connector assembly comprises a first retaining half securely mounted on a printed substrate, a load plate pivotally attached to the first retaining half, a second retaining half opposite and distant to the first retaining half, a lever pivotally attached to the second retaining half and including a cam portion capable of pushing down a pressed section from the clip toward the printed substrate, and a connector mounted between the first and second retaining halves.

Other objects, advantages and novel features of the invention will become more apparent from the following detailed description of the present embodiment when taken in conjunction with the accompanying drawings.

DETAILED DESCRIPTION OF THE INVENTION

Figure 1:
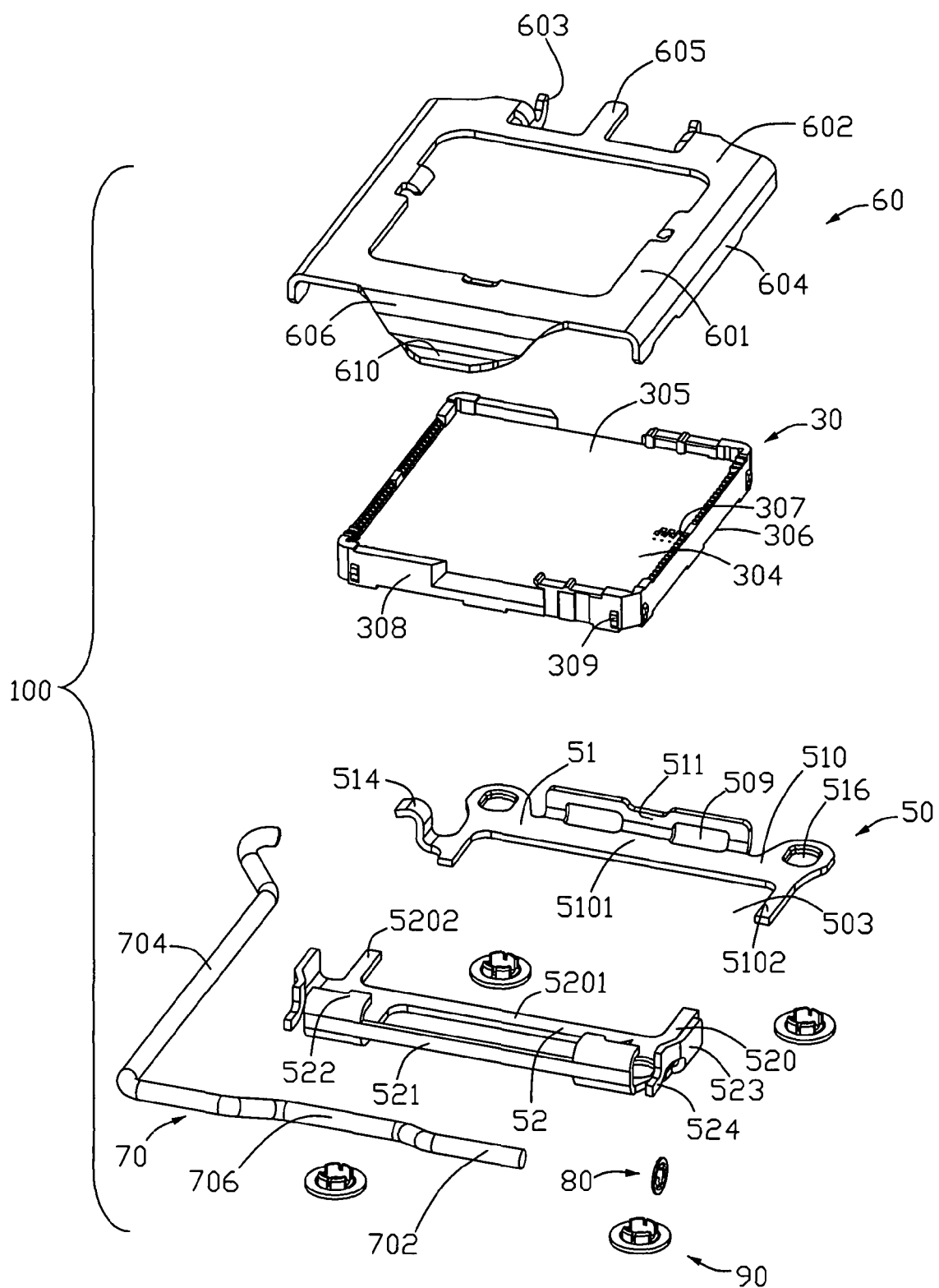
FIG. 1 is an exploded, perspective view of an electrical connector in accordance with a preferred embodiment of the present invention.

Reference will now be made to the drawing figures to describe the present invention in detail.

Figure 2:
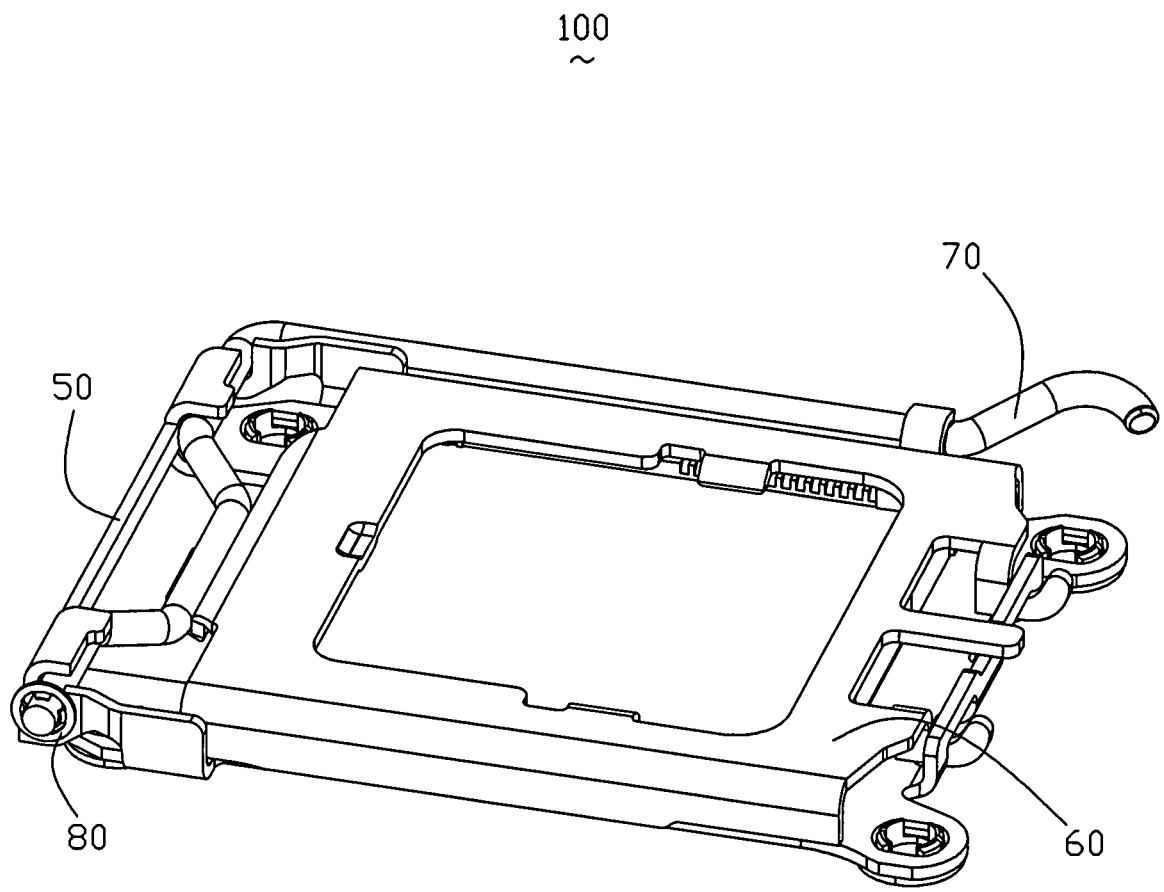
FIG. 2 is an assembled, perspective view of the electrical connector in accordance with the preferred embodiment of the present invention.

Please refer FIGS. 1-2, an electrical connector 100 in accordance with a preferred embodiment of the present invention for electrically connecting a chip module (not shown) to a printed circuit board (not shown) comprises an insulative housing 30, a plurality of contacts (not shown) to be accommodated in the insulative housing 30, a stiffener 50 partially surrounding the insulative housing 30, a load plate 60 pivotally mounted to one side of the stiffener 50 for pressing on the chip module, and a lever 70 pivotally mounted to opposite side of the stiffener 50 to latch with the stiffener 50.

The insulative housing 30 is a substantially rectangular board and comprises a flat central accommodating section 304 and four vertical sidewalls 308 extending uprightly from four sides of the accommodating section 304. The accommodating section 304 comprises a top supporting surface 305 for supporting the chip module, an opposite bottom mounting surface 306 for mounting to the printed circuit board, and a plurality of contact-receiving passages 307 penetrating through the supporting surface 305 and the mounting surface 306. The contact-receiving passages 307 are arranged in matrix. The contacts are received in the contact-receiving passages 307 with one ends thereof extending beyond the supporting surface 305 for being elastically compressed by conductive pads (not shown) of the chip module, and the other ends thereof equipped with solder balls (not shown) extending beyond the mounting surface 306 for soldering the contacts to corresponding solder points of the printed circuit board. A plurality of protrusions 309 are formed on outer periphery of the sidewalls 308 and adjacent to joint corner of adjacent two sidewalls 308 for interferentially engaging with the stiffener 50 to retain the insulative housing 30 to the stiffener 50.

The stiffener 50 is a frame-shape like and comprises a first retaining half 51 to which the load plate 60 is pivotally mounted, and a second retaining half 52 to which the lever 70 is pivotally mounted. The first retaining half 51 is separate from the second retaining half 52 and the two retaining halves 51, 52 together define a receiving space 503 to receive the insulative housing 30. The first retaining half 51 comprises a flat first base portion 510 and a vertical front wall 511 which defines a pair of retaining recesses 509. The first base portion 510 is U-shape and comprises a flat first main section 5101 and a pair of first stretching arms 5102 extending rearward from opposite outermost edges of the first main section 5101. Thus, the first main section 5101 and the pair of first stretching arms 5101 form a half of the receiving space 503 together. An arc-shape latching portion 514 extends upwardly from one side of the first base portion 510 for latching with the lever 70. The second retaining half 52 comprises a second base portion 520 and a rear wall 521 bending upwardly from the second base portion 520. The second base portion 520 is also of U-shape and comprises a flat second main section 5201 and a pair of second stretching arms 5202 extending forwardly from outermost edges of the second main section 5201. Therefore, the second main section 5201 and the second stretching arms 5202 together form the other half of the receiving space 503. A pair of arc-shape retaining tabs 522 bends upwardly then flatly from the rear wall 521. A pair of lateral walls 523 extends upwardly from opposite lateral sides of the second main section 5201 with a pair of supporting ribs 524 respectively extending rearward from lower edges thereof. The lever 70 is reliably pivotally mounted to the second retaining half 52 via the retaining tabs 522 and the supporting ribs 524. Four fastening slots 516 are formed at four corners of the first and second main sections 5101, 5201 with four gaskets 90 interferentially received in the fastening slots 516.

The lever 70 is bent from a metal rod and comprises substantially horizontally-extending a retaining portion 702 pivotally mounted to the second retaining half 52 of the stiffener 5 and substantially vertically-extending an operating portion 704 extending perpendicularly from one end of the retaining portion 702. Further, the retaining portion 702 forms a middle horizontal cam portion 706 parallel to and in front of left and right sections (not labeled) with a pair of arc sections (not labeled) connecting the cam portion 706 and the left and right sections. The cam portion 706 is capable of compressing a part of the load plate 60. A ring-shape restriction ring 80 is positioned to the left end of the retaining portion 702 for restricting the rotation angle of the lever 70.

The load plate 60 is hollow metal frame and comprises a hollow main body 601 with rectangular shape and a pair of lateral walls 60 bending downwardly from lateral edges of the main body 601. The front end of the main body 601 is a mounting area and forms a pair of fishhook-shape latching portions 603 bending from a front edge of the main body 601 for latching into the pair of retaining recesses 509. A flat restriction bar 605 extends forwardly from the front edge of the main body 601 to locate between the pair of latching portions 603 for preventing excessive rotation of the load plate 60. The rear end of the main body 601 is a pressing area and forms a tongue portion 606 extending rearward from a rear edge of the main body 601 with gradually-decreased width. A flat tip pressed section 610 is formed at a free end of the tongue portion 606 for being pressed by the cam portion 706 of the lever 70 to realize the close position of the load plate 60.

In assembly, the insulative housing 30 with the contacts and the stiffener 50 are interferentially engage with each other via the protrusions 309 latching with the stiffener 50. Then the contacts are soldered to the printed circuit board. The latching portions 603 of the load plate 60 and the retaining portion 702 are respectively pivotally assembled to the retaining recesses 509 of the first retaining half 51 and the retaining tabs 522 of the second retaining half 52. Then, the first and second retaining halves 51, 52 are fastened to the printed circuit board via fastening means (not shown) to realize the electrical connection between the contacts and the printed circuit board. Then, the chip module is placed on the insulative housing 30 to electrically connect with the contacts and the load plate 60 partially covers the chip module. Then, the lever 70 is rotated until the cam portion 706 thereof presses on the pressed section 610, and the operating portion 704 is pressed by the latching portion 514 of the first retaining half 514 to realize the stable electrical connection between the chip module and the printed circuit board.

Since the stiffener 50 consists of two separate first and second retaining halves 51, 52, that is a first device 51 and a second device 52, the material connecting the first and second retaining halves 51, 52 are omitted. Further, the waste material in stamp process is also decrease. Therefore, the whole cost of the stiffener 50, even the electrical connector 100 is decreased.

Figure 3:
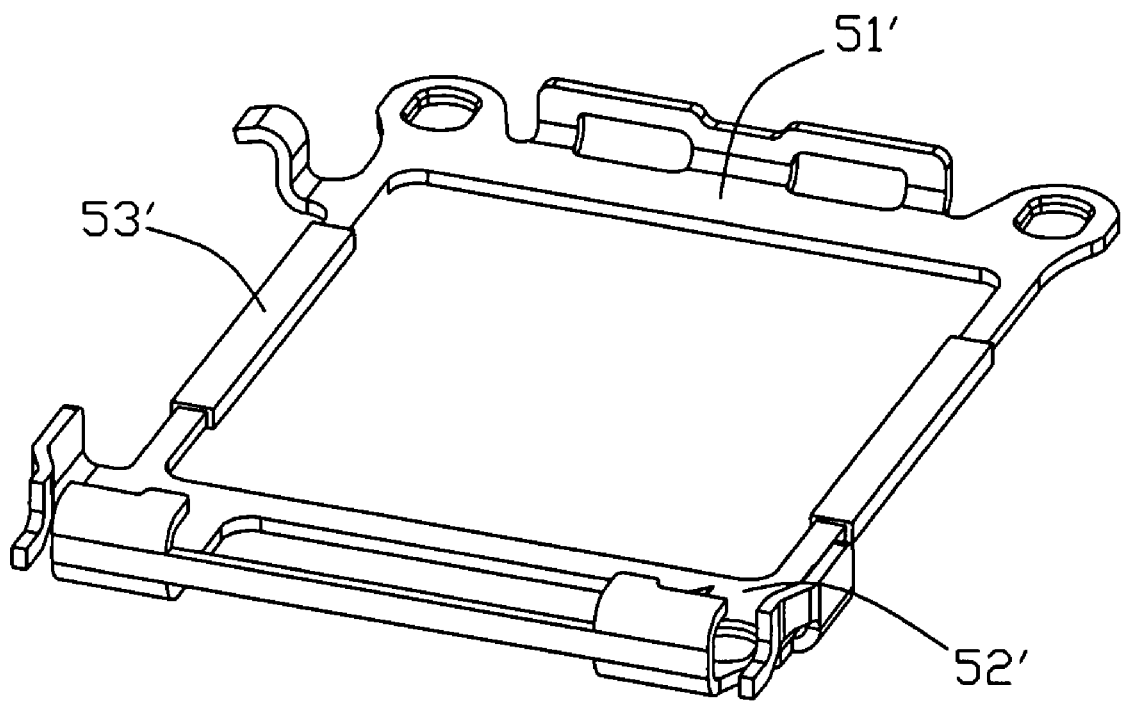
FIG. 3 a perspective view of a stiffener in accordance with another embodiment of the present invention.

Please refer to FIG. 3, a second embodiment of the present invention is shown. The structure of the second embodiment is substantially same as that of the electrical connector 100 of the preferred embodiment except that the first and second retaining halves 51', 52' are connected with each other by a pair of plastic connecting members 53'. The connecting members 53' can be inserted molded with the first and second retaining halves 51, 52', or the connecting members 53' defines receiving spaces to receive corresponding parts of the first and second retaining halves 51' 52' to realize the connection between the connecting members 53' and the first and second retaining halves 51', 52'. Since the connecting members 53' are made from plastic material which is cheaper compared with the stainless steel, the cost of the electrical connector is also decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly mounted onto a printed substrate and adapted for electrically connecting a chip to the printed substrate, comprising:
   a first retaining half securely mounted on a printed substrate;
   a load plate pivotally attached to the first retaining half;
   a second retaining half opposite and distant to the first retaining half;

a lever pivotally attached to the second retaining half and including a cam portion capable of pushing down a pressed section from the clip toward the printed substrate;

a connector mounted between the first and second retaining halves; and at least one connecting member connecting the first retaining half with the second retaining half.

2. The electrical connector as claimed in claim 1, wherein each retaining half contacts three sides of the connector.

3. The electrical connector as claimed in claim 1, each retaining half comprises a U-shape base portion to surround the insulative housing.

4. The electrical connector as claimed in claim 1, wherein each retaining half comprises a main section and a pair of stretching arms extending perpendicularly from the main section to form a U-shape.

5. The electrical connector as claimed in claim 4, wherein the at least one connecting member connects the stretching arms of the first and second retaining halves to connect the first retaining half with the second retaining half.

6. The electrical connector as claimed in claim 4, the at least connecting member is a pair of connecting members respectively connecting the stretching arms of the first and second retaining halves.

7. The electrical connector as claimed in claim 6, wherein the connecting members are insert molded with the stretching arms of the first and second retaining halves.

8. The electrical connector as claimed in claim 6, wherein the connecting members are assembled with the stretching arms of the first and second retaining halves.

9. The electrical connector as claimed in claim 1, wherein the lever is pivotally mounted to the second retaining half and positioned by the first retaining half.

10. The electrical connector as claimed in claim 9, wherein the first retaining half defines a retaining recess, and wherein the load plate forms a latching portion rotatably received in the retaining recess of the first retaining half.

11. An electrical connector adapted for electrically connecting a chip module to a printed circuit board, comprising:

an insulative housing defining a plurality of contact-receiving passages;

a plurality of contacts received in the contact-receiving passages;

a stiffener comprising a first retaining half and a second retaining half separate from each other and respectively assembled to the insulative housing;

a load plate being equipped with the first retaining half; and a lever being equipped with the second retaining half and locked by the first retaining half.

12. The electrical connector as claimed in claim 11, further comprising a connecting member connecting the first retaining half with the second retaining half.

13. An electrical connector comprising:

an insulative housing defining an upward receiving cavity;

a plurality of contacts disposed in the housing with contacting portions upwardly extending into the receiving cavity; and a pair of discrete stiffeners respectively located by two sides of the housing; wherein each of said stiffeners is equipped with a first retention structure for securely assembling to a printed circuit board on which the housing is positioned and a second retention structure which delicately holds the housing in a float manner under a force pressure; wherein one of the stiffeners is equipped with a pivotal load plate and the other one is equipped with a pivotal lever.

14. The electrical connector as claimed in claim 13, further including a gasket positioned under the first retention structure.

15. The electrical connector as claimed in claim 13, wherein the one of the stiffeners on which the load plate is assembled, holds the lever in position.

16. The electrical connector as claimed in claim 13, wherein a plastic connection member connects said pair of stiffeners together.

17. The electrical connector as claimed in claim 16, wherein said plastic connection member own resiliency which allows relative movement between the pair of stiffeners in a vertical direction during respectively fastening said pair of stiffeners to the printed circuit board.

18. The electrical connector as claimed in claim 16, wherein said plastic connection member is insert molded with the pair of stiffeners.

* * * * *